United States Patent [19]

Wong et al.

[11] Patent Number: 4,608,503
[45] Date of Patent: Aug. 26, 1986

[54] APPARATUS FOR DRIVING FIRST AND SECOND DEVICES

[75] Inventors: Thomas H. Wong, Sunnyvale; John W. Chu, Cupertino, both of Calif.

[73] Assignee: Advanced Micro Devices, Inc., Sunnyvale, Calif.

[21] Appl. No.: 436,762

[22] Filed: Oct. 25, 1982

[51] Int. Cl.⁴ .................... H03K 3/01; H03K 17/86
[52] U.S. Cl. .............................. 307/270; 307/240; 307/490
[58] Field of Search .............. 307/270, 240–244, 307/454, 289; 328/103, 104, 150, 154

[56] References Cited

U.S. PATENT DOCUMENTS 3,783,307  1/1974  Breur ............................... 307/243
3,838,296  9/1974  McLeod ........................... 307/243
4,145,623  3/1979  Doucette ......................... 307/289

Primary Examiner—Stanley D. Miller
Assistant Examiner—B. P. Davis
Attorney, Agent, or Firm—Patrick T. King; Mark A. Haynes; J. Vincent Tortolano

[57] ABSTRACT

A dual bus driver including a voltage input, a current source, a single data input, a first driver transistor for driving one bus, a second driver transistor for driving the other bus, a first pair of differential transistors for turning on either the first driver transistor or the second driver transistor to couple an input signal at the data input to the one bus or the other bus, and a second pair of differential transistors for disabling both driver transistors. By providing a driver that drives both buses, reduced power consumption, fewer circuit components and less integrated circuit layout complexities are achieved.

9 Claims, 3 Drawing Figures

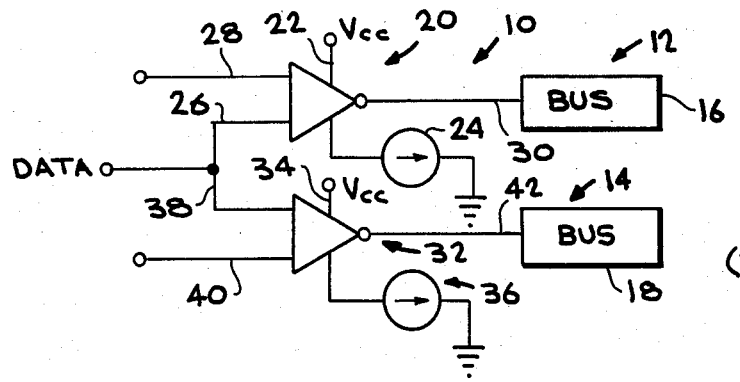
FIG. 1
(PRIOR ART)
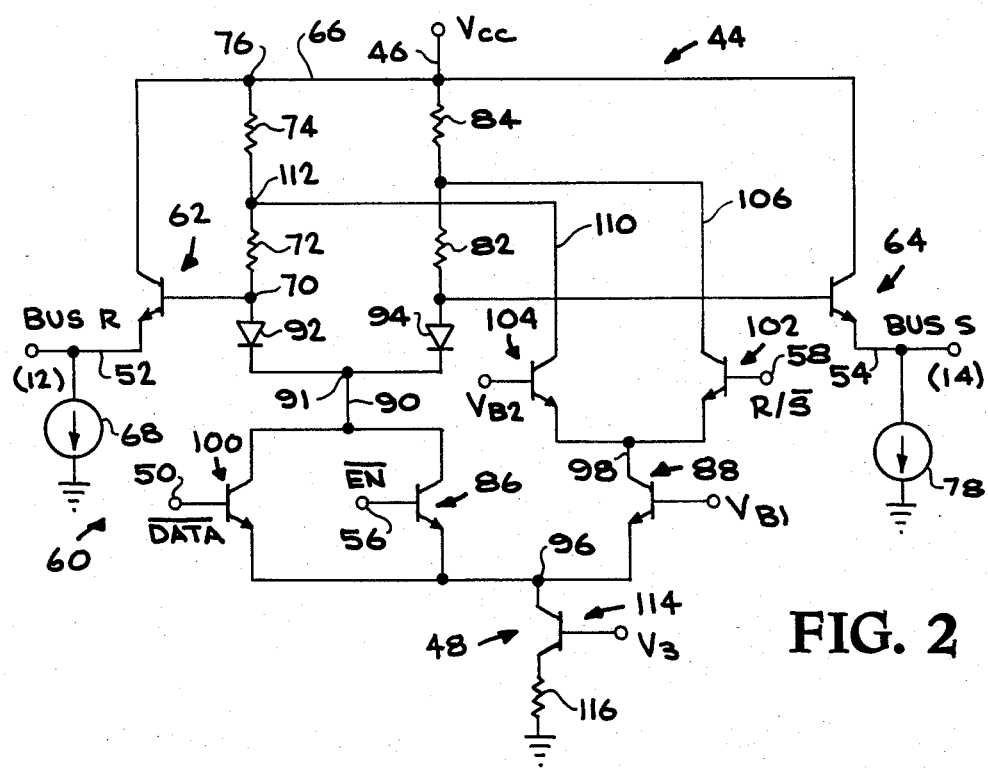
FIG. 2
| EN | R/S̄ | DATA | BUS R | BUS S |
|---|---|---|---|---|
| 1 | X | X | 0 | 0 |
| 0 | 1 | 1 | 0 | 0 |
| 0 | 1 | 0 | 1 | 0 |
| 0 | 0 | 1 | 0 | 0 |
| 0 | 0 | 0 | 0 | 1 |
FIG. 3

4,608,503

APPARATUS FOR DRIVING FIRST AND SECOND DEVICES

DESCRIPTION

1. Technical Field

The present invention relates to apparatus for driving first and second devices and, more particularly, to apparatus for driving two different buses.

2. Background Art

Electronic circuit components known generically as drivers are employed for driving other components or devices. Typically, a number of drivers are used for driving an equal number of devices, respectively. Thus, for example, two separate or different drivers are used for driving two separate or different devices.

In one particular example, the devices can be two different buses which are part of a data processing system and which are driven by two respective drivers. Each driver will have its own source voltage input and current source to power the driver, together with its own circuit components to perform the driving functions. Usually, the same data input signal is applied in parallel to the inputs of the two drivers, whose respective outputs can be the data signal, inverted or non-inverted, which is applied to one or both of the buses.

One disadvantage with the prior apparatus is that power must be supplied for each driver in the data processing system, thereby increasing the amount of power that is consumed as each driver is added to the system. Also, additional circuit components must be used for each driver in the system. Concomitantly, if the drivers are implemented on a single chip using integrated circuit (IC) technology, then the layout of the integrated circuit having the several drivers becomes more complicated. Furthermore, because the data input signal is applied in parallel to the inputs of both drivers, it must be "overloaded" to be able to drive both buses.

The present invention is directed to overcoming all the above problems.

SUMMARY OF THE INVENTION

The invention is an apparatus for controlling a first device and a second device, including a voltage input, a current source, a single data input for receiving an input signal, means, coupled between the voltage input and the current source, for controllably driving the first device or the second device, in which the driving means has a first output connectable to the first device and a second output connectable to the second device, and in which the driving means couples the input signal from the single data input to the first output or the second output.

The first and second devices can be, for example, two different buses which are controllably driven by the apparatus of this invention. Such an apparatus constitutes a single driver for both buses in which data at the single data input can be coupled to one or the other bus via either the first output or the second output. As one specific example, the data at the single data input and the data coupled to either bus are inverted versions of one another. This single driver has one voltage input and one current source which powers the apparatus to perform its control functions.

BRIEF DESCRIPTION OF THE DRAWINGS

FIG. 1 is a block diagram of prior drivers.

FIG. 2 is a schematic illustration of an embodiment of the present invention.

FIG. 3 is a truth table used to explain the embodiment of FIG. 1.

DETAILED DESCRIPTION OF THE INVENTION

FIG. 1 shows prior apparatus 10 for driving a first device 12 and a second device 14. The device 12 and device 14 can each be, for example, a data bus 16 and a data bus 18. A driver 20 has its own voltage input 22 and current source 24 to power it. Driver 20 also has a data input 26 for receiving a data input signal, an enabling input 28 for receiving an enabling signal and a data output 30 for coupling the data input signal to the data bus 16. Circuit components inside driver 20 couple the data input signal on line 26 to the output 30, whereby bus 16 is driven.

Another separate driver 32 has its own voltage input 34 and current source 36 to power it. Driver 32 also has a data input 38 for receiving the data input signal that also is fed in parallel to driver 20 over line 26, as well as an enabling input 40 for receiving an enabling signal and a data output 42 for coupling the data input signal on line 34 to the data bus 18. Circuit components inside driver 32 couple the data input signal on line 34 to the output 42, whereby bus 18 is driven.

FIG. 2 shows an apparatus 44 of the present invention for driving the first device 12 and the first device 14. Similarly, device 12 and device 14 can be, respectively, the data bus 16 and the data bus 18 which, for ease of description, are also referenced as bus R and bus S, respectively.

Apparatus 44 has a voltage input 46 and a current source shown generally at 48. Apparatus 44 also has a single data input 50 for receiving a data signal $\overline{\text{DATA}}$, an output 52 connectable to bus R and an output 54 connectable to bus S. Apparatus 44, furthermore, has an enabling input 56 for receiving an enabling signal $\overline{\text{EN}}$ and a control signal input 58 for receiving a bus driving control signal R/S. The truth table of FIG. 3, as will be further described, indicates the logic state of bus R and bus S as a function of the logic state of $\overline{\text{EN}}$, R/S and $\overline{\text{DATA}}$.

A circuit means 60 of apparatus 44 controllably drives the bus R and bus S in response to $\overline{\text{EN}}$, R/S and $\overline{\text{DATA}}$. Means 60 includes a driver transistor 62 and a driver transistor 64. Driver transistor 62 has a collector coupled to voltage input 46 via a line 66, an emitter coupled to bus R via output 52 and a current source 68 and a base coupled to voltage input 46 via a junction 70, a resistor 72, a resistor 74, a junction 76 and line 66. Driver transistor 64 has a collector coupled to line 66, an emitter coupled to bus S via output 54 and a current source 78 and a base connected to voltage input 46 via a junction 80, a resistor 82, a resistor 84 and line 66.

A differential pair of transistors 86, 88 are used to disable or enable driver transistor 62 and driver transistor 64, simultaneously. Transistor 86 has a collector coupled to voltage input 46 through one path including a line 90, a junction 91, a Zener diode 92, junction 70, resistor 72, resistor 74, junction 76 and line 66, and through another path including line 90, junction 91, a Zener diode 94, junction 80, resistor 82, resistor 84 and line 66. The emitter of transistor 86 is coupled via a junction 96 to current source 48 and then to ground, while the base of transistor 86 is connected to input 56 to receive $\overline{\text{EN}}$.

The other transistor 88 of the differential pair 86, 88 has a collector coupled to a line 98, an emitter coupled to current source 48 via junction 96 and a base which receives a reference voltage signal $V_1$.

A transistor 100 is in parallel with transistor 86 and has a collector coupled to line 90 via a junction 101, an emitter coupled to current source 48 via junction 96 and a base coupled to data input 50 to receive $\overline{DATA}$.

Another differential pair of transistors 102, 104 is used to enable or turn on either driver transistor 62 or driver transistor 64 in dependence on R/S. Transistor 102 has a collector coupled to voltage input 46 via a line 106, a junction 108, resistor 84 and line 66, together with an emitter coupled to line 98 and a base coupled to input 58 to receive R/S. Transistor 104 has a collector coupled to voltage input 46 via a line 110, a junction 112, resistor 74, junction 76 and line 66, together with an emitter coupled to line 98 and a base for receiving a reference voltage signal $V_2$.

Current source 48 includes a transistor 114 having a collector coupled to junction 96, an emitter coupled to ground via a resistor 116 and a base for receiving a voltage $V_3$ to bias on transistor 114.

Industrial Applicability

In the operation of apparatus 44, and with reference to the truth table of FIG. 3, if $\overline{EN}$ is high or logic 1, then transistor 86 is turned on and transistor 88 is turned off. Consequently, a circuit path is completed from voltage input 46 through line 66, junction 76, resistor 74, resistor 72, junction 70, diode 92, junction 91, line 90, junction 101, transistor 86, junction 96 and current source 48 to ground. This reverse biases the base of driver transistor 62 via junction 70 to turn off driver transistor 62. Therefore, bus R is at logic 0. Also, consequently another circuit path is completed from voltage input 46 through resistor 84, junction 108, resistor 82, junction 80, diode 94, junction 91, line 90, junction 101, transistor 86, junction 96 and current source 48 to ground. This reverse biases the base of driver transistor 64 via junction 80 to turn off driver transistor 64. Therefore, bus S is at logic 0.

If $\overline{EN}$, R/S and $\overline{DATA}$ are, logically, 011, the following occurs. Transistor 86 is turned off in response to $\overline{EN}$ being logic 0 and transistor 100 is turned on in response to $\overline{DATA}$ being at logic 1, whereby transistor 88 is turned off. Therefore, a path is completed from voltage input 46 through line 66, junction 76, resistor 74, junction 112, resistor 72, junction 70, diode 92, junction 91, line 90, junction 101, transistor 100, junction 96 and current source 48 to ground. Therefore, driver transistor 62 is biased off via junction 70 being at logic 0. This means that bus R will carry $\overline{DATA}$ inverted, i.e., a logic 0. It can also be seen that transistor 64 will be biased off since junction 80 is at logic 0, whereby bus S is at logic 0.

Assume now that $\overline{EN}$, R/S and $\overline{DATA}$ are, logically, 010. Therefore, transistor 86 and transistor 100 are turned off, as a result of $\overline{EN}$ being at logic 0 and $\overline{DATA}$ at logic 0, so that transistor 88 is turned on. Also, transistor 102 is biased on since R/S is a logic 1, whereby transistor 104 is turned off. Consequently, a circuit path is completed from voltage input 46 through resistor 84, junction 108, line 106, transistor 102, line 98, transistor 88, junction 96 and current source 48 to ground. Therefore, junction 80 is at logic 0 to turn off transistor 64 so that bus S is at logic 0. Moreover, with transistor 104 being off, together with transistor 86 and transistor 100 being off, junction 70 is at logic 1 to turn on transistor 62. Consequently, output 52 and bus R are at logic 1, which is the inverse of $\overline{DATA}$.

If $\overline{EN}$, R/S and $\overline{DATA}$ are at logic 001, respectively, transistor 86 is off, transistor 102 is off, transistor 88 is off, and transistor 100 is on, respectively. With the latter being on, driver transistor 62 is off, so that output 52 and bus R are at logic 0. Driver transistor 64 also will be off, whereby output 54 and bus S are at logic 0, which is the inverse of $\overline{DATA}$.

Assume now that $\overline{EN}$, R/S and $\overline{DATA}$ are at logic 000, respectively. Transistor 86, transistor 100 and transistor 102 are off. Therefore, transistor 88 and transistor 104 are on. Consequently, junction 70 is at logic 0 to turn off transistor 62 so that bus R is at logic 0, but junction 80 is at logic 1 to turn on transistor 64, whereby output 54 and bus S are at logic 1, which is the inverse of $\overline{DATA}$.

In summary, apparatus 44 is a single driver that responds to a single input signal $\overline{DATA}$ by coupling it to bus R or bus S as enabled by $\overline{EN}$ and as controlled by R/S. To power circuit means 60 of apparatus 44 for driving bus R and bus S only a single voltage input 46 and current source 48 are utilized. Furthermore, since only single data input 50 is used for driving bus R and bus S, the signal $\overline{DATA}$ need not be "overloaded" as it would be if used for two drivers, as shown in FIG. 1.

Other aspects, objects and advantages of the invention can be obtained from a study of the drawings, the disclosure and the appended claims.

We claim:

1. An apparatus for controlling a first device and a second device, comprising:
   (a) a voltage input;
   (b) a current source;
   (c) a single data input for receiving an input signal; and
   (d) means coupled between and powered by said voltage input and said current source for selectively driving the input signal at the first device or the second device, said selectively driving means having a first driver with a first output connectable to the first device, a second driver with a second output connectable to the second device;
   (e) means for turning on either said first driver or said second driver whereby the input signal drives either the first device or second device, respectively; and
   (f) means for disabling said first driver and said second driver.

2. An apparatus, according to claim 1, wherein said first driver and said second driver are transistors.

3. An apparatus for controlling a first bus and a second bus, comprising:
   (a) a voltage input;
   (b) a current source;
   (c) a single data input means for receiving an input signal;
   (d) first means, coupled between and powered by said voltage input and said current source, for driving the input signal at the first bus, said first driving means having a first output;
   (e) second means, coupled between and powered by said voltage input and said current source, for driving the input signal at the second bus, said second driving means having a second output;
   (f) means responsive to a bus driving control signal, for selectively turning on said first driving means or said second driving means to couple the input signal from said single data input means to said first output or said second output, respectively; and (g) means, responsive to bus disabling control signals, for disabling said first driving means and said second driving means, said disabling means including a differential pair of transistors, a first of said transistors having a base for receiving a reference signal and a second of said transistors having a base for receiving the bus disabling control signal.

4. An apparatus, according to claim 3, wherein said means for turning on comprises a differential pair of transistors, a first of said transistors having a base for receiving a reference signal and a second of said transistors having a base for receiving the bus driving control signal.

5. An apparatus, according to claim 3, wherein said single data input means comprises a third transistor being in parallel with said second transistor.

6. An apparatus, according to claim 3, wherein said first means for driving and said second means for driving each comprises a driver transistor.

7. A driver for driving a first bus and a second bus, comprising:

(a) a voltage input;
(b) a current source;
(c) a first driver transistor having a first output for connection to the first bus;
(d) a second driver transistor having a second output for connection to the second bus;
(e) a first differential pair of transistors including a first transistor having a first base for receiving a first reference signal and a second transistor having a second base for receiving a first control signal, said first control signal having one logic value for turning on said first driver transistor and another logic value for turning on said second driver transistor;
(f) a second differential pair of transistors including a third transistor having a third base for receiving a second reference signal and a fourth transistor having a fourth base for receiving a second control signal, said second control signal having one logic value for disabling said first driver transistor and said second driver transistor and another logic value for enabling said first driver transistor and said second driver transistor and said fourth transistor having a fourth collector connected to the emitters of said first differential pair of transistors; and
(g) a fifth transistor having a fifth base for receiving a data input signal, said fifth transistor being in parallel with said fourth transistor; and
(h) wherein said first driver transistor, said second driver transistor, said first differential pair of transistors, said second differential pair of transistors and said fifth transistor are connected between and powered by said voltage input and said current source.

8. An apparatus for controlling a first bus and a second bus, comprising:

a voltage input;
a current source;
a single data input means for receiving an input signal;
first means, coupled between said voltage input and said current source, for driving the input signal at the first bus, said first driving means having a first output;
second means, coupled between said voltage input and said current source, for driving the input signal at the second bus, said second driving means having a second output;
means, responsive to a bus driving control signal, for controllably turning on said first driving means or said second driving means to couple the input signal from said single data input means to said first output or said second output, respectively; and
means, responsive to a bus disabling control signal, for disabling said first driving means and said second driving means including a differential pair of transistors, a first of said transistors having a base for receiving a reference signal and a second of said transistors having a base for receiving the bus disabling control signal.

9. An apparatus, according to claim 8, wherein said single data input means comprises a third transistor being in parallel with said second of said transistors.

* * * * *